United States Patent
Tinaztepe et al.

[11] Patent Number: 5,913,022
[45] Date of Patent: *Jun. 15, 1999

[54] LOADING HARDWARE PATTERN MEMORY IN AUTOMATIC TEST EQUIPMENT FOR TESTING CIRCUITS

[75] Inventors: Cihan Tinaztepe, San Jose; Givargis A. Danialy, San Mateo, both of Calif.

[73] Assignee: Schlumberger Technologies, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/573,071

[22] Filed: Dec. 15, 1995

[51] Int. Cl.⁶ ........................................................ G06F 11/00
[52] U.S. Cl. .................. 395/183.01; 395/183.06; 395/184.01; 371/21.1; 371/22.1
[58] Field of Search .................. 371/21.1, 21.5, 371/22.1, 22.2, 22.5, 22.6, 27.1; 395/183.01, 183.06, 184.01

[56] References Cited

U.S. PATENT DOCUMENTS

| | | | |
|---|---|---|---|
| 4,777,355 | 10/1988 | Takahira | 235/380 |
| 5,157,781 | 10/1992 | Harwood et al. | 395/183.01 |
| 5,521,833 | 5/1996 | Lesch | 364/489 |

OTHER PUBLICATIONS

Tinaztepe et al.; "OOP Comes to ATE"; *Test & Measurement*; Oct. 1992; Cahners Publishing Company.

*Primary Examiner*—Hoa T. Nguyen
*Attorney, Agent, or Firm*—Fish & Richardson P.C.

[57] ABSTRACT

A system for testing circuits includes a tester having a pattern memory for storing test vectors; an object database to store a persistent vector pattern object including a pattern of test vectors; and an object-oriented database management server process. The server process is a computer program configured to run on a server processor in communication with the object database. The server process and the tester operate together to obtain the vector pattern object from the object database and to load the pattern of test vectors from the object into the pattern memory. The tester can have a processor to run a database client process. The vector pattern object can include member functions to modify the vector pattern. In another aspect, the system includes a programmable tester that has a pattern memory to store test vectors; and a database server process on a computer in communication with an object database storing a copy of a pattern memory database object that includes a computer-readable representation of a state of the pattern memory. The tester can execute a client process to request a copy of the pattern memory database object. In one implementation, the pattern memory manager object includes the identity, location, and status of each pattern in the pattern memory of the tester.

36 Claims, 2 Drawing Sheets

LOADING HARDWARE PATTERN MEMORY IN AUTOMATIC TEST EQUIPMENT FOR TESTING CIRCUITS

BACKGROUND OF THE INVENTION

1. Field of the Invention

The present invention relates to a software and hardware architecture for the loading and execution of test programs for automatic test equipment for testing circuits, such as integrated circuits or circuit boards. More particularly, the present invention relates to an object-oriented architecture for loading and managing test vectors and patterns of test vectors in a tester.

2. Background

Automatic test equipment for testing electronic circuits ("ATE testers" or, simply, "testers") normally operate under control of a program loaded in the tester itself and executing on the tester hardware. The test hardware generally includes an embedded computer that performs higher-level data management and control functions for the tester. An example of automatic test equipment in which the invention may be used is the system described in U.S. Pat. No. 5,212,443 to West et al. for Event Sequencer For Automatic Test Equipment ("West"), the disclosure of which is incorporated herein by this reference. A software architecture for the development and execution of test programs for such automatic test equipment is described in commonly-owned provisional U.S. patent application Ser. No. 60/003,010 for ATE TEST PROGRAMMING ARCHITECTURE, filed Aug. 31, 1995, the disclosure of which is incorporated herein by this reference.

A test vector is a cycle of operations that applies data to all the pins of the device under test at the same time. Vectors generally include opcodes, operands, and format data for each pin definition. A pattern is a sequence of test vectors. Test programs on a tester generally include large patterns of test vectors, which in the aggregate may exceed one gigabit of data. Consequently, a major challenge for automatic test equipment is the loading and management of test vectors of large size with speed and flexibility.

SUMMARY OF THE INVENTION

In general, in one aspect, the invention provides a system for the execution of test programs including vector patterns for testing circuits. The system includes programmable tester having an embedded control computer on which a test program runs and a pattern memory for storing vector patterns; an object-oriented database management server process coupled to an object database; and a pattern memory manager object (PPMM) in the object database, the PPMM including encapsulated data describing the status of the tester's pattern memory. In another aspect, the PPMM of the system is a persistent object. In another aspect, the encapsulated data of the PPMM further includes contents of the tester's pattern memory. In another aspect, the encapsulated data of the PPMM also includes the identity, location, and status of each pattern in the tester's pattern memory. In another aspect, the object-oriented database management server process of the system runs on a second computer and the object database is stored on long-term mass storage media on the second computer, which media may be a hard disk. In another aspect, the test program running in the tester's embedded computer maintains an image copy of the PPMM. In another aspect, the system has a second object database and, in the second object database, a persistent vector pattern object encapsulating a vector pattern for loading into the tester's pattern memory, the vector pattern object also including member functions to modify the vector pattern and the vectors in the pattern. In another aspect, the system has a cache manager process running on the tester's embedded computer that provides functions invoked to maintain coherency in the copies of the PPMM.

In general, in another aspect, the invention provides a system for the execution of test programs including vector patterns for testing circuits. The system includes a programmable tester with an embedded control computer on which a test program runs and a pattern memory for storing vector patterns; an object-oriented database management server process coupled to an object database; and a persistent vector pattern object in the object database, the vector pattern object encapsulating a vector pattern for loading into the tester's pattern memory, the vector pattern object also having member functions to modify the vector pattern and the vectors in the pattern. In another aspect, the vector pattern encapsulated in the vector pattern object is in a compressed binary form.

The invention has a number of advantages.

For example, the invention provides for the efficient storage and retrieval patterns of vectors. The invention also provides access to vector patterns in a way that makes the vectors and patterns easy to edit and debug during development. The invention also provides for the rapid loading of vector patterns into tester hardware. The invention can deal quickly and efficiently with very large vector patterns.

Use of a high-performance object database (ODB) to store compressed pattern objects provides good performance both in time and space. With device-oriented vectors and patterns, such as are provided in the West system, use of a high-performance ODB to store compressed pattern objects also provides a common database server for both design and test environments. In such an environment, pattern objects can be retrieved efficiently, without undue data manipulation or translation, for loading into tester hardware. With a common database server, changes made by a user can be reflected instantaneously in the database without need for recompilation. For the test program development tools, tool performance is enhanced by fetching (without translation) on the relevant data from the pattern database server. The client-server distribution allows for optimization of resource use, independence of server sites, and increased concurrency.

By combining device-oriented vectors and object-oriented persistent storage, the invention allows the same vectors, viewed by different application objects, to be used in the design as well as in the test stage. This also makes it easy to build tools to visualize vectors and patterns in different ways.

The invention enables the tester programming environment to avoid the time-consuming task of reloading into tester memory vector patterns that are already there. This is advantageous with a two-headed tester that shares vector pattern memory in the tester, as well as for reuse of patterns in separate, sequentially loaded test programs.

The invention facilitates the replacement of patterns and vectors including the fast addition, modification, and deletion of patterns and vectors.

For a fuller understanding of the nature and further advantages of the invention, reference should be made to the detailed description taken in conjunction with the accompanying drawings.

BRIEF DESCRIPTION OF THE DRAWINGS

The accompanying drawings, which are incorporated in, and constitute a part of, the specification, schematically illustrate specific embodiments of the invention and, together with the general description given above and the detailed description of the embodiments given below, serve to explain the principles of the invention.

DETAILED DESCRIPTION

Figure 1:
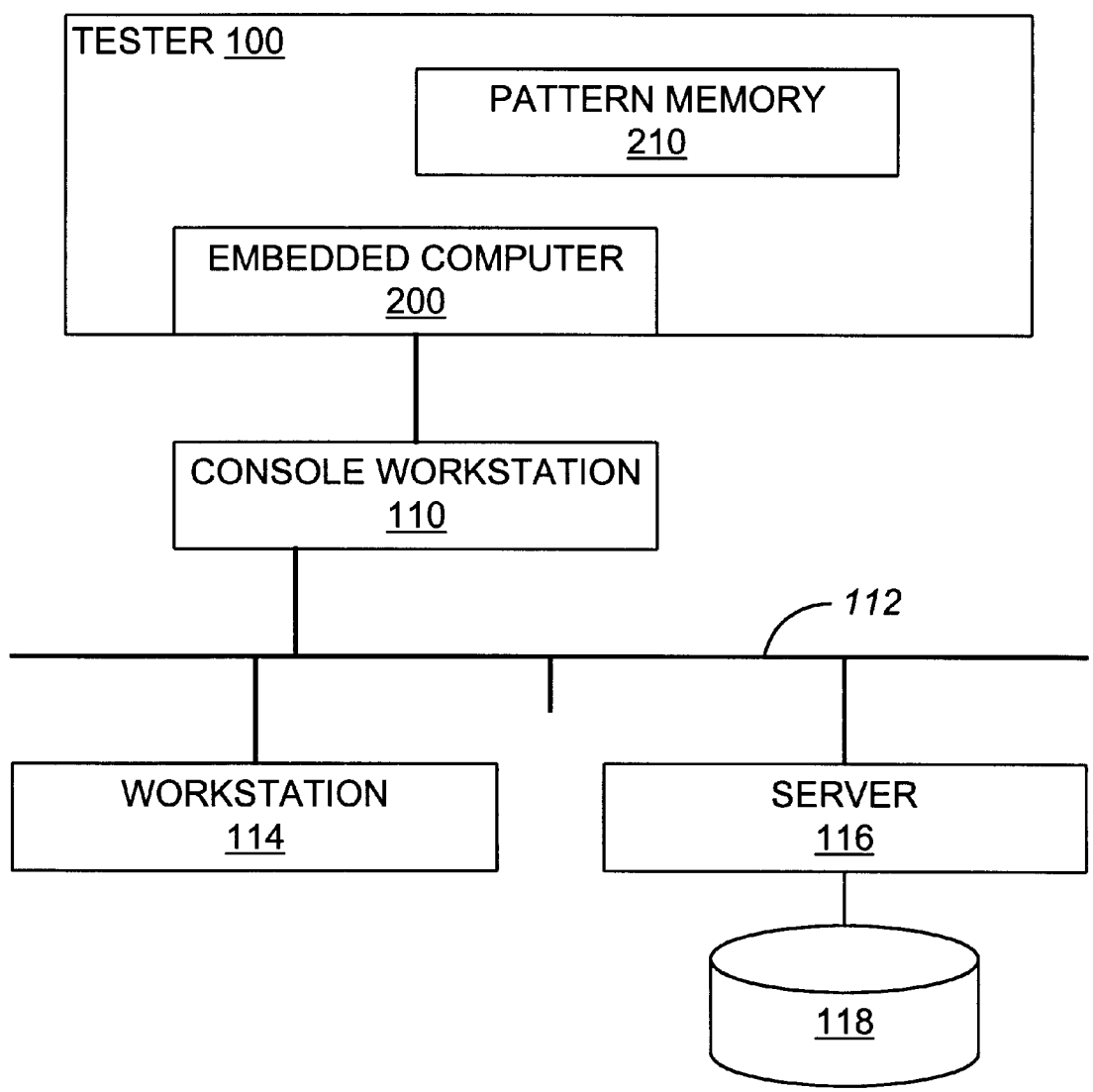
FIG. 1 is a block diagram illustrating a test hardware environment.

Turning to FIG. 1, a tester 100 operates under software control, including under the control of an embedded computer 200 executing a test program stored in a random access memory. The embedded computer may communicate with, and operate under control of, a console computer 110, such as an engineering workstation, that is part of the tester 100 or that is connected to the tester by a bus or by a network connection 112, such as an Ethernet connection. The tester 100 may be connected to other computers 114, including server computers 116 for storing test programs and test vector patterns on mass data stores 118.

Figure 2:
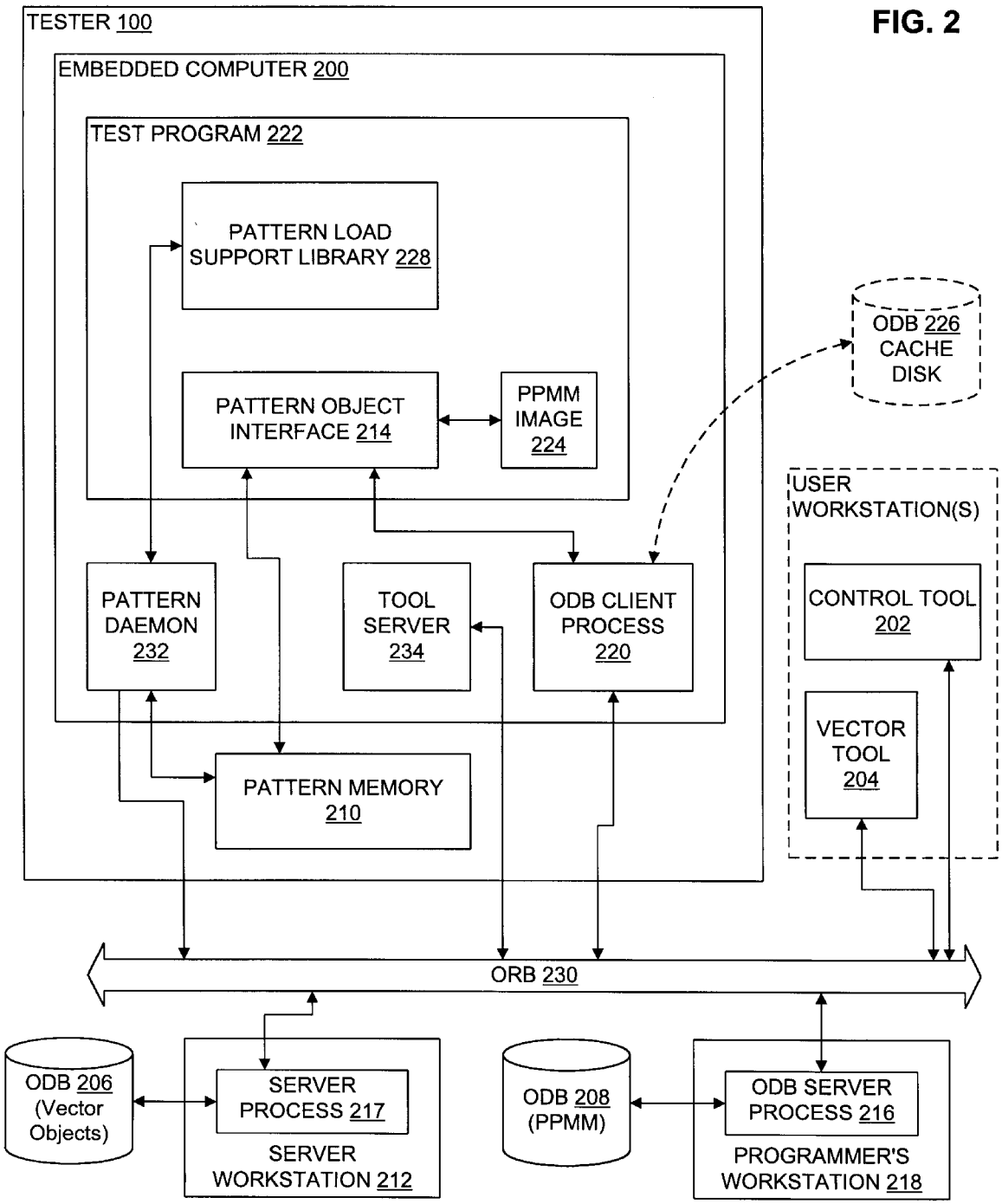
FIG. 2 is a block diagram of a software architecture for a tester in accordance with the present invention.

Turning to FIG. 2, the tester 100 uses an interactive, object-oriented programming environment that provides a suite of software tools that interact with pre-defined data structures to control the tester. The tools (graphical user interface applications) include, for example, a ControlTool 202, which initializes the user interface and starts up tools requested (directly or indirectly) by the user; a SelectionTool (not shown), which allows the user to select a test program from a program database (not shown); a FlowTool (not shown), which allows the user to specify a sequence of tests and gives an overview of a complete test program; and a VectorTool 204, which allows the user to edit vectors and vector patterns. In addition to generation through interactive use of the tools, test programs can also be generated from source code that compilers (not shown) of the programming environment translate into the required forms of objects. Source code generation is useful whenever test programs would be generated automatically. For example, source code would be one natural form in which to receive vector output from a design simulation system.

In the tester programming environment, test vector patterns and other test program components make up test blocks. These blocks are programmed and stored as objects in an object-oriented database (such as ODBs 206 and 208) under an object-oriented database management system (OODBMS). The term object is used in the object-oriented programming sense: an object generally has member data and member functions, including encapsulated data and public member functions to perform operations with the encapsulated data. One such OODBMS is ObjectStore, which is available from Object Design, Inc. of Boston, Mass. ObjectStore is an Object Database Management Group (ODMG) compliant object-oriented database management system.

Individual standalone and composite test blocks make up a complete test program. (A composite test block is a defined sequence of tests within a test block.) The test program flow can easily be changed by changing the execution sequence of its test blocks.

The programming in the tester's embedded computer 200 includes an interface to the application tools such as VectorTool 204; a runtime system that includes code to run the tester hardware and code to run test programs, including code to interpret the program components that are loaded as blocks; and test program blocks, which will differ from one test program to another.

An individual test normally includes both event sequences and vector patterns. Vector patterns in the tester are stored in a set of memories that will be referred to in the aggregate as pattern memory 210. Because vector patterns can be very large, it is generally not desirable to store or manipulate patterns in text form. Vectors and patterns are normally stored in a compiled and compressed binary form to save space. The compressed form is decompressed by decompression hardware in the tester when vector patterns are loaded into the tester. Patterns are often loaded in sets defined by pattern lists.

Normally, pattern services, including the services provided by the object-oriented database (ODB) 206, are common to a number of applications that can be distributed across a network. In this case, physical storage of patterns is controlled by a server node 212 on the network. Applications served by the ODB 206 include the front-end application tools (described above) and the tester hardware itself—or, more precisely, processes, such as tool server 234, running on the tester's programmed embedded computer 200. The embedded computer 200 includes a precessor 201 to execute the instructions of such processes.

A distributed architecture for the tester and programming environment follows the CORBA model. The CORBA (Common Object Request Broker Architecture) is defined by the Object Management Group (OMG) as an interface specification for implementing distributed objects across a network. CORBA object services, for objects such as pattern objects in an ODB 206, provide the mechanisms by which objects transparently make and receive requests and responses. With an Object Management Architecture (OMA) compliant object interface, the pattern loader (pattern daemon 232), an application entity that loads patterns into tester hardware, obtains patterns through a CORBA compliant Object Request Broker (ORB) 230.

Application objects, such as the VectorTool 204, are enabled in this architecture to communicate transparently with other application objects, such as the ControlTool 202, and object services, such as vector pattern objects in ODB 206. The VectorTool 204 has a graphical user interface in the OSF/Motif style and is written in C++. It is written using customized X Window System (X11) support for display. Vectors in a pattern contain data that may include opcodes, operands and format data for each pin definition. The user-scrollable information is divided into two data dimensions: the vectors and the pin definitions. Each data dimension is managed by a data interval manager that provides a window on the actual object data dimension. This manager also provides scrolling and other interface support. For any given display snapshot, only those data that are on the display are retrieved by the data interval manager.

Information about the data and the functions of a tester's pattern memory are combined in an object called the PPMM (Persistent Pattern Memory Manager). Normally, this will be stored in an ODB 208 separate from the one on which vector pattern objects are stored. The ODB 208 runs under an ODB server process 216, typically on a programmer's workstation 218. The data portion of the PPMM includes a map of the pattern memory (i.e. what is in tester pattern memory, the "PM map"). The member functions of the PPMM object provide information and services to the test program.

In this and the following discussion, the PPMM objects and other aspects of the software architecture will be described in terms of their operation in a tester. However, these components operate in the same way when invoked to simulate a tester environment.

During the loading of a test program into a tester, the data contents of the PPMM object are memory mapped by the ODB server process 216 and ODB client process 220 into an image 224 in the addressing space of the test program 222 in the tester's embedded control computer 200. It will thus appear to the test program 222 that the PM map is part of the test program's data structures.

The PPMM object is created, stored, and maintained on disk in ODB 208 through the ODB client 220 and server 216 software. The object is therefore persistent and retained even after its test program 222 is unloaded from the tester 100. The client process 220 for the ODBs 206 and 208 runs in the tester embedded computer 200. It typically, but optionally, maintains a local disk cache 226 of the ODB, for reasons of speed, and so is called the cache manager process.

The PPMM object resides in, and remains persistent in, the ODB server workstation computer 218. A PPMM object is identified with its tester by name; that is, one of its attributes is the name of the tester to which it belongs. The illustrated host 212 and 218 are workstation computers having processors 213 and 219, respectively, to execute their respective processes. An ODB server process 216 or 217 runs on a server host 212 or 218 and communicates with the test program 222 and the user application tools, such as the VectorTool 204, through the cache manager process 220. The application tools determine which server to use, as there typically will be more than one. Both client and server processes are normally running and accessible, i.e., they are not normally terminated.

On request from an application tool, an ODB server process 216 retrieves the PPMM object corresponding to the tester 100 (or to the tester being simulated, in the case of a simulation) and delivers it to the client process 220. During test program execution, if the object is cached locally, a copy resides on the cache disk 226. As has been mentioned, the PPMM is also memory mapped into the test program for immediate, full speed access. However, this mapped copy is not persistent. PPMM is maintained by the cache disk manager and the ODB server process. The PM map and the tester pattern memory itself are maintained and modified only through pattern load support library 228 functions, or through the ODB client 220 or server 216 processes. These software components ensure the PPMM object on the ODB server computer 218, the PPMM on the cache disk 226, and the mapped memory image 224 are kept cache coherent. If a test program 222 unexpectedly terminates, for example, the PPMM object will retain the last state of the tester pattern memory. This allows the immediate reload of the same test program without reloading those test patterns that are already resident in the tester pattern memory 210. If a different test program is loaded that can use patterns already resident in the pattern memory, the PPMM will allow the application software to forego reloading those patterns. Finally, in a tester having one pattern memory and two test heads and running two test programs, a PPMM can manage patterns for both programs.

As has been mentioned, a PPMM object represents the current contents of its test pattern memory 210, and the object contains the functions needed to access the representation. There is thus a one-to-one relationship between the physical hardware pattern memory 210 and its PPMM object. For reasons of efficiency and robustness, a separate ODB 208 is used to store each PPMM, one for each actual tester. At any given moment, the pattern memory 210 for a tester 100 has a well-defined content (including 'invalid'), which will be captured and maintained by the PPMM for the tester. Also, since each tester has one pattern memory, there is need for exactly one PPMM object for each tester, and each object can be stored in its own database. The database can thus conveniently be stored on the tester's console workstation disk. The ODB server process 216 software can also be run on the console workstation. The cached copy of the PPMM, if not stored on a disk local to the tester embedded computer, can be stored anywhere on the local network to which the tester is connected.

As a persistent repository of the current state of the tester's pattern memory, the PPMM can, as a selectable option, enable the reuse of patterns stored in pattern memory. A pattern may be reused (rather than reloaded) only if the full pattern name and date of the pattern identified in the load request match those of the pattern in pattern memory 210, the pattern memory image of the pattern has not been modified, and the user requesting reuse has access rights to the pattern.

When a pattern is changed in pattern memory, by a test engineer, for example, the pattern is marked as modified in the PPMM. When a pattern is resized (for example, by adding or deleting a vector using VectorTool 204), the PPMM will keep the current location of the pattern in the pattern memory as long as the pattern does not grow into other used areas. When it does, the PPMM finds a new location for the pattern and has it moved.

For compatibility with earlier versions of tester software that did not use the PPMM, and for future releases that may have incompatible PPMM databases, a task tracks the versions of software run on a tester and notifies the PPMM if an old version has been run and the PPMM data may no longer be valid.

When the operation of a tester is simulated, the software that runs in a tester's embedded processor runs on a workstation instead. Normally, the application tools would also be run on that workstation, and the ODB cache disk would be attached to it. The memory mapped image of the PPMM for the simulated tester exists, and the patterns may or may not be loaded into simulated pattern memory, depending on the simulation options. Each active simulation session requires one PPMM object and consequently, in the scheme described above, one ODB; however, one ODB server process can serve multiple simulation sessions.

A PPMM is a container for maps, which are objects of type "ppmm_map" (a class). A map is a list of handles, which are objects of type "ppmm_handle" (a class). In one embodiment, where the pattern memory of the tester includes different kinds of memory, the PPMM may have multiple maps, one to keep track of each different kind of memory that is a part of the pattern memory of the tester. The handles in a map collectively represent the used portions of the tester pattern memory corresponding to the map, with each handle representing the state of a contiguous portion of that memory. Normally, a handle for a used portion of pattern memory will uniquely correspond to the entirety of one pattern stored there in the tester. The unused portions may also be represented in handles, as is the case in the embodiment described below.

The members of ppmm_map include the member data described in the following table. It also includes the member data and functions of its base type, a list of handles. (Data types and sizes are generally omitted in the tables below for the sake of brevity and clarity.)

| Name | Description |
| --- | --- |
| base | first tester memory location represented by the map |
| size | tester memory size represented by the map |
| used | total memory used |
| lock | busy flag |
| smallest_block | smallest block of tester memory that may be created (allocated) |
| block_alignment | word boundary on which to create blocks |
| parity_errors | list of parity errors |
| bad_memory | list of bad memory locations |

The ppmm_map class has conventional public member functions to set and return the values of member data. The ppmm_map member functions also include the functions described in the following table. (Function arguments are generally omitted in the tables below for the sake of brevity and clarity.)

| Name | Description |
| --- | --- |
| first_available_handle | returns a pointer to the first handle in the map whose size is greater or equal to the requested size, in the requested direction (up or down) |
| count_parity_error | logs parity error occurring at a location |
| get_handle_at | gets the handle at a specified location (a handle "at" a location is one that represents a range of memory in which the location is found) |
| allocate_handle_in_end (old_handle, pointer_to_pattern, usage_type, size, direction) | allocates a new handle from the end (in the specified direction) of a handle (old_handle) for of the specified amount of tester memory for the specified usage for tester memory carrying the specified pattern; the specified tester memory is reassigned from old_handle to the new handle; old_handle is removed if it now refers to no tester memory |
| allocate_handle_in_middle (..., mem_addr) | like allocate_handle_in_end, only the new handle is allocated for a specified tester memory address that is in middle of old_handle |
| allocate_handle | finds the specified amount of memory in the free space (unused tester memory), allocates a new handle, and inserts the handle in the list of handles (before or after the free space) |
| reallocate_handle | reallocates the size of the handle to the specified size; if the handle cannot be expanded to the new size, releases the handle and allocates a new one, so that the tester memory represented by the handle will change |
| allocate_handle_at | allocates a handle at a specified location, if possible; returns a pointer to the handle on success |
| mark_bad | marks location of tester memory as bad |
| mark_good | remove location from bad memory list |
| combine_handles | combines two handles into one handle; deletes the second handle |
| unallocate_handle | releases (frees) a handle in the map; combines it into other free handles, if possible |

A handle object has member data describing a portion of tester memory, including the portion's location and size (user requested and physically allocated), a pointer to the corresponding pattern object, and internal flags, including flags as indicating the use being made of the tester memory.

The ppmm_handle class has conventional public member functions to set and return the values of the member data.

The "ppmm_pattern" class is the base class for pattern objects. All pattern objects inherit from classes derived from this class. The member data of ppmm_pattern include the protected data described in the following table.

| Name | Description |
| --- | --- |
| name | name of the pattern |
| tp_name_initial_load | name of test program that initially loaded the pattern |
| initial_load_time | data and time pattern initially loaded |
| package_name | name of the device package in which the circuit being tested is packaged |
| curr_pindef | pin definition table with which this pattern was loaded |
| labels | labels defined within the pattern to identify relative addresses of vectors |
| common | pointer to the common pattern, if any, that is included by reference in this pattern (common pattern can be shared and used by the other patterns, like a parameter definition file, to hold vector definitions and pattern subroutines) |
| group_id | code indicating whether, and with whom, sharing of the pattern is permitted |
| pm_image_modified | flag indicating whether image of pattern in tester has been modified ("dirty flag") |
| compile_time | pattern's compile time and date |
| interested_tps | the test programs "interested" in the pattern (an interested test program is one that has loaded the pattern) |

The ppmm_pattern class has conventional public member functions to set and return the values of the member data. The class also has virtual member functions to get and set handles for patterns. In a tester environment, where pattern memory consists of different memories for specific purposes, the virtual functions may include separate functions to get and set handles for each different kind of pattern memory in the tester. Similarly, where a single pattern may embody different functions that are stored separately in the tester, a pattern object may include multiple handles, one for each function (usage), and the member functions for the pattern object will include functions to get and set the corresponding handles. In this way, any form of tester memory organization can be supported with a structure of handles corresponding to he structure of test memory use.

The ppmm_pattern member functions also include the functions described in the following table. (Data types and sizes and function arguments are generally omitted for the sake of brevity and clarity.)

| Function | Description |
| --- | --- |
| get_interested_tp(index) | returns the index'th "interested" test program for this pattern |
| resize_handle | resizes a handle; returns a pointer to the resized handle; the pointer may point to a different handle if the resized handle had to be reallocated at a different location |
| unallocate_all_handles | unallocate all handles for a pattern |

Objects of the class "ppmm_test_program" are used to track test programs. The member data for this class includes identifiers for the test program and for its user and a list of the patterns loaded for the test program. The public member functions include conventional functions to get and set data, including the functions described in the following table.

| Function | Description |
|---|---|
| get_pattern | returns the first instance of the pattern having a specified name that is loaded for the test program |
| get_compile_time | gets date and time the specified pattern was compiled |
| pattern_reloaded | called when a pattern is "reloaded": resets compile and load time data; resets memory image dirty flag |
| unload_pattern | unloads the pattern for this test program: means program is no longer "interested" in the pattern; does not unallocate or remove pattern from tester memory |
| unload | unloads all patterns for this test program |

As has been mentioned, a PPMM is a container for maps. It is an object of type "ppmm_pmm" (a class). Its member data includes pointers to the maps in the container, which would conveniently be one map for each kind of memory in the tester. It also includes a table of all the pattern instances in tester memory known to the PPMM, a list of all test programs in the tester, a version number, and flags. Its public member functions include conventional functions to get and set data and also the functions described in the following table.

| Function | Description |
|---|---|
| get_map | returns a pointer to the map object for a specified tester memory type |
| usage_get_map | returns a pointer to the map object for a specified type of handle (usage) |
| allocate_handle | allocates a handle in the map for a specified pattern, size, and type of handle (usage) |
| allocate_pattern | allocates a pattern object of the requested type of the specified size for the specified test program |
| invalidate | invalidates all of the patterns objects: resets all of the test program objects; unallocates all of the unused patterns; results in all patterns being unused |
| unallocate_pattern | removes all information about a pattern in test memory; all of the related objects (such as pattern objects and handles) are deleted |
| unallocate_all_unused_patterns | unallocates all unused pattern instances from a list of patterns (an unused pattern is one that is not loaded by any test program, that is, no test program is interested in it at this time) |
| pattern_already_loaded | checks whether a pattern of a specified name is loaded and can be reused; if so, returns a pointer to the pattern object and the specified test program is added to the programs interested in the pattern (a loaded pattern is reusable only if the requesting user is a member authorized to use it and if it has not been compiled or become dirty since loaded) |

-continued

| Function | Description |
|---|---|
| load_pattern | actually loads a pattern of a specified name for a specified test program and with specified memory size, first checking for possible reuse; allocates all needed handles and registers the pattern for the test program |

The present invention has been described in terms of specific embodiments. The invention, however, is not limited to these specific embodiments. Rather, the scope of the invention is defined by the following claims, and other embodiments are within the scope of the claims.

What is claimed is:

1. A system for testing circuits, comprising:
    a programmable tester operable to test a circuit, said tester including
        a embedded computer operable to perform data management and control functions for said tester, and
        a pattern memory coupled to said embedded computer and operable to store test vectors,
    a second computer operable to execute a database server process said second computer coupled in communication with an object database, said object database storing a copy of a vector pattern object, said vector pattern object comprising encapsulated data card member functions, said encapsulated data including a vector pattern comprising test vectors, said member functions operable to modify said vector pattern and said test vectors; and
    a database client process, said embedded computer also operable to execute said database client process, said execution of said database client process generating a request to said database server process, said database server process responding to said request by providing a copy of said vector pattern object to said embedded computer, such that said embedded computer obtains from said object database, through said database server process, said test vectors for storage in said pattern memory.

2. The system of claim 1, wherein said vector pattern is in a compressed binary form.

3. The system of claim 1, wherein the embedded computer and the second computer are distinct computers.

4. A method of managing a hardware pattern memory of a tester of a kind that is programmable to operate under control of a test program to apply data defined by test vectors to a device under test, the method comprising:
    establishing a memory store in a storage device coupled to the tester to store a map representing some aspects of the current state of the hardware pattern memory of the tester;
    loading into the hardware pattern memory a sequence of test vectors forming a vector pattern for testing the device under test; and
    updating the map in the memory store to reflect any change in said some aspects of the state of the hardware pattern memory caused by the loading of the sequence of test vectors into the hardware pattern memory.

5. The method of claim 4, further comprising:
    coupling to the tester an object-oriented vector pattern database storing vector patterns and performing the step of loading a vector pattern by loading the pattern from the object-oriented vector pattern database.

6. The method of claim 4, further comprising:

loading into the tester a test program that includes specific vector patterns and as part of the loading process examining the map in the memory store to determine which, if any, of the specific vector patterns are already loaded in the hardware pattern memory and foregoing the loading of already-loaded vector patterns.

7. The method of claim 6, further comprising:

retaining the map in the memory store for later use after the test program is unloaded from the tester, whereby information about the state of the pattern memory of the tester is preserved.

8. The method of claim 7 further comprising:

modifying contents of the hardware pattern memory of the tester and corresponding state information in the memory store together so as to maintain the memory store as a repository of current information about the hardware pattern memory.

9. A system for testing a circuit, comprising:

a programmable tester operable to test a circuit, said tester including
  a first computer operable to execute a test program, said execution of said test program testing the circuit, and
  a pattern memory operable to store test vectors;
a second computer operable to execute a database server process, said second computer coupled in communication with an object database, said object database storing a copy of a pattern memory database object, said pattern memory database object including a computer-readable representation of a state of said pattern memory; and
a database client process, said first computer also operable to execute said database client process in conjunction with said execution of said test program, said execution of said database client process generating a request to said database server process, said database server process responding to said request by providing a copy of said pattern memory database object to said test program, such that said test program obtains from said object database, through said database server process, said representation of a state of said pattern memory.

10. The system of claim 9 wherein the pattern memory database object is a persistent object storing a current state of the pattern memory.

11. The system of claim 10, wherein the test program mains an image copy of the pattern memory database object and maintains a one-to-one relationship between (i) current contents of the pattern memory and (ii) the pattern memory database object in the object database.

12. The system of claim 9 wherein the pattern memory database object comprises encapsulated content data, said encapsulated content data comprising a replica of contents of the pattern memory of the tester.

13. the system of claim 9 wherein the pattern memory database object comprises encapsulated map data, said encapsulated map data comprising a map of the identity, location, and status of each pattern in the pattern memory of the tester.

14. The system of claim 9, wherein the object database is stored on long-term mass storage media comprising a hard disk.

15. The system of claim 9, further comprising:

a second object database; and
a persistent vector pattern object in the second object database, the vector pattern object including encapsulated data, said encapsulated data including a vector pattern for loading into the pattern memory, said vector pattern comprising test vectors, the vector pattern object also including member functions, said member functions operable to modify the vector pattern and the test vectors in the vector pattern.

16. the system of claim 15 further comprising:

a cache memory, connected locally to the tester, for caching a copy of the pattern memory database object;
a cache manager process, the first computer also operable to execute said cache manager process, execution of said cache manager process operating to maintain coherency of copies of the pattern memory database object residing in the cache memory and in the object database.

17. The system of claim 16, wherein said cache memory comprises a hard disk connected locally to the tester.

18. A system for testing a circuit, comprising:

a programmable tester operable to run a test program to test a circuit and to run a database client process, the programmable tester having a pattern memory operable to store test vectors;
an object database configured to store a copy of a pattern memory database object that includes a computer-readable representation of a state of the pattern memory; and
a database server process configured to run on a server processor in communication with the object database and in communication with the database client process, the database server process being configured to respond to a request from the database client process by providing a copy of the pattern memory database object to the database client process.

19. The system of claim 18, wherein:

the server processor is incorporated in the tester.

20. The system of claim 18, wherein:

the tester is operable to provide a test program addressing space in which to run the test program; and
the database server process and the database client process are operable to map the computer-readable representation in the copy of the pattern memory database object into the test program addressing space, whereby the computer-readable representation is made available to the test program.

21. A system for testing circuits, comprising:

a programmable tester operable to run a test program to test a circuit and to run a database client process, the tester having a pattern memory operable to store vector patterns;
an object database configured to store a persistent vector pattern object that includes a vector pattern; and
a database server process configured to run on a server processor in communication with the object database and in communication with the database client process, the database server process being configured to respond to a request for the vector pattern by providing a copy of the vector pattern object to the tester the tester, being operable to obtain from the vector pattern object the vector pattern for storage into the pattern memory.

22. The system of claim 23, wherein:

the vector pattern object includes member functions operable to modify the vector pattern.

23. A system for testing circuits, comprising:

a tester for testing a circuit. the tester having a pattern mermory for storing test vectors;
an object database configured to store a persistent vector pattern object comprising a pattern of test vectors; and an object-oriented database management server process, the server process being a computer program comprising instructions configured to run on a server processor in communication with the object database, the server process and the tester together being operable to obtain the vector pattern object from the object database and to load the pattern of test vectors from the vector pattern object into the pattern memory.

24. The system of claim 23, wherein:

the vector pattern object includes member functions operable to modify the vector pattern.

25. A computer program embodied in a tangible medium and configured to operate in conjunction with a programmable tester for testing circuits, the tester being operable to run a test program and having a pattern memory for storing test vectors, the computer program comprising instructions operable to:

obtain a copy of a persistent vector pattern object from an object database, the vector pattern object including a pattern of test vectors;

provide a copy of the pattern of test vectors from the vector pattern object to the tester; and load the pattern of test vectors into the pattern memory.

26. The computer program of claim 25, wherein:

the vector pattern object includes member functions operable to modify the vector pattern.

27. The computer program of claim 25, further comprising instructions to:

provide a database server process configured to run on a server processor in communication with the object database and to respond to a request for the pattern of test vectors by providing the copy of the vector pattern object to the tester.

28. The computer program of claim 27, further comprising instructions to:

provide a database client process configured to run on a processor in the tester and to generate a request to the database server process for the pattern of test vectors.

29. The computer program of claim 25, wherein the vector pattern object includes member functions operable to modify the vector pattern, the computer program further comprising instructions to:

provide a database server process configured to run on a server processor in communication with the object database and to respond to a request for the pattern of test vectors by providing the copy of the vector pattern object to the tester; and provide a database client process configured to run on a processor in the tester and to generate a request to the database server process for the pattern of test vectors.

30. A computer program embodied in a tangible medium and configured to operate in conjunction with a programmable tester for testing circuits, the tester being operable to run a test program and having a pattern memory for storing test vectors, the computer program comprising instructions operable to:

provide a client process configured to run in the tester;

create computer-readable representation of a state of the pattern memory; and provide a server process configured to run in communication with a database and in communication with the client process, the server process being configured to respond to a request from the client process by providing a copy of the computer-readable representation from the database to the client process.

31. The computer program of claim 30, wherein:

the server process is configured to run in the tester.

32. The computer program of claim 30, wherein:

the tester is operable to provide a test program addressing space in which to run the test program; and the database server process and the database client process are operable to map the computer-readable representation into the test program addressing space, whereby the computer-readable representation is made available to the test program.

33. The computer program of claim 30, wherein the database is an object database and the computer-readable representation is encapsulated in a pattern memory database object.

34. The computer program of claim 33, wherein the pattern memory database object encapsulates a replica of contents of the pattern memory of the tester.

35. The computer program of claim 33, wherein the pattern memory database object comprises encapsulated map data, said encapsulated map data comprising a map of the identity, location, and status of each pattern in the pattern memory of the tester.

36. The computer program of claim 30, further comprising instructions operable in the test program to:

maintain a one-to-one relationship between (i) current contents of the pattern memory and (ii) a copy of the computer-readable representation of the pattern memory.

* * * * *

UNITED STATES PATENT AND TRADEMARK OFFICE
CERTIFICATE OF CORRECTION

PATENT NO. : 5,913,022
DATED : June 15, 1999
INVENTOR(S) : Tinaztepe et al.

It is certified that error appears in the above-indentified patent and that said Letters Patent is hereby corrected as shown below:

```
In claims,
Column 10, line 28, change "card" to --and--.
```

Signed and Sealed this

Sixteenth Day of November, 1999

Attest:

Q. TODD DICKINSON

*Attesting Officer*    *Acting Commissioner of Patents and Trademarks*